US007340065B2

(12) United States Patent
Nakamura et al.

(10) Patent No.: US 7,340,065 B2
(45) Date of Patent: Mar. 4, 2008

(54) ACTIVE NOISE CONTROL SYSTEM

(75) Inventors: Yoshio Nakamura, Neyagawa (JP); Masahide Onishi, Osaka (JP); Toshio Inoue, Wako (JP); Akira Takahashi, Wako (JP)

(73) Assignees: Matsushita Electric Industrial Co., Ltd., Osaka (JP); Honda Giken Kogyo Kabushiki Kaisha, Tokyo (JP)

( * ) Notice: Subject to any disclaimer, the term of this patent is extended or adjusted under 35 U.S.C. 154(b) by 805 days.

(21) Appl. No.: 10/855,242

(22) Filed: May 27, 2004

(65) Prior Publication Data

US 2004/0240678 A1 Dec. 2, 2004

(30) Foreign Application Priority Data

May 29, 2003 (JP) ............................ 2003-151827

(51) Int. Cl.
*G10K 11/16* (2006.01)
*H03B 29/00* (2006.01)

(52) U.S. Cl. .................... 381/71.11; 381/86; 381/94.1; 381/71.8

(58) Field of Classification Search ............... 381/71.4, 381/71.11, 71.1, 71.8; 708/322; 700/28; 379/406.01; 455/570
See application file for complete search history.

(56) References Cited

U.S. PATENT DOCUMENTS 5,485,523 A * 1/1996 Tamamura et al. ........ 381/71.4
5,689,572 A * 11/1997 Ohki et al. ................ 381/71.3
5,912,821 A * 6/1999 Kobayashi .................. 700/280
6,216,047 B1 * 4/2001 Goto ........................... 700/28
7,020,288 B1 * 3/2006 Ohashi ....................... 381/71.4
7,062,049 B1 * 6/2006 Inoue et al. ............... 381/71.4

FOREIGN PATENT DOCUMENTS

JP 2000-099037 4/2000

* cited by examiner

*Primary Examiner*—Vivian Chin
*Assistant Examiner*—Con P. Tran
(74) *Attorney, Agent, or Firm*—Jordan and Hamburg LLP

(57) ABSTRACT

An active noise control system is provided which cancels a noise using a sound radiated from a speaker driven by an output from an adaptive notch filter. The system employs output signals from an adder or simulation cosine-wave and sine-wave signals, an error signal or an output signal from a microphone, and a compensated signal from the adder or a signal available for acoustically transferring an output from the adaptive notch filter to the microphone in accordance with initial transfer characteristics to update the filter coefficient of the adaptive notch filter. This configuration allows the system to operate with stability even when the acoustic transfer characteristics vary with time or under circumstances where there exists a significant amount of incoming external noises. The system also prevents over-compensation for a noise at the ears of a passenger in a vehicle, thereby proving an ideal noise reduction effect.

4 Claims, 10 Drawing Sheets

ACTIVE NOISE CONTROL SYSTEM

The present disclosure relates to subject matter contained in priority Japanese Patent Application No. 2003-151827, filed on May 29, 2003, the contents of which is herein expressly incorporated by reference in its entirety.

BACKGROUND OF THE INVENTION

1. Field of the Invention

The present invention relates to an active noise control system which produces a signal that is interfere with and attenuates an uncomfortable confined engine noise generated in the passenger compartment of a vehicle by the operation of the engine, the signal being equal in amplitude and opposite in phase with the confined engine noise.

2. Description of the Related Art

The confined engine noise is a radiant noise which is generated by a vibrational force, created by the operation of the engine of a vehicle, being transferred to the vehicle body and thus causing resonance to occur in the passenger compartment or a closed space under a certain condition. Thus, the confined engine noise has noticeable periodicity in synchronization with the rotational speed or frequency of the engine.

A conventionally known active noise control system for reducing such uncomfortable confined engine noise adopts a method of providing feedforward adaptive control using an adaptive notch filter (e.g., see Japanese Laid-Open Patent Publication No. 2000-99037). FIG. 10 is a view illustrating the configuration of a conventional active noise control system disclosed in Japanese Laid-Open Patent Publication No. 2000-99037.

Referring to FIG. 10, a discrete computation for implementing the active noise control system is performed in a discrete-computation processor unit 17 such as a DSP (Digital Signal Processor). First, a wave shaper 1 removes noises or the like superimposed on an engine pulse while shaping the engine pulse. The resulting output signal from the wave shaper 1 is supplied to a cosine-wave generator 2 and a sine-wave generator 3, where a cosine wave and a sine wave are created as a reference signal. The reference cosine-wave signal or an output signal from the cosine-wave generator 2 is multiplied by a filter coefficient W0 of a first one-tap adaptive filter 5 in an adaptive notch filter 4. Similarly, the reference sine-wave signal or an output signal from the sine-wave generator 3 is multiplied by a filter coefficient W1 of a second one-tap adaptive filter 6 in the adaptive notch filter 4. The output signal from the first one-tap adaptive filter 5 and the output signal from the second one-tap adaptive filter 6 are added together at an adder 7, which in turn supplies the resulting output signal to a secondary noise generator 8. The secondary noise generator 8 produces a secondary noise, which is then interfere with and cancels the noise caused by the engine pulse. At this time, a residual signal that remains from the acoustic coupling in a noise suppressor portion is employed as an error signal "e" for use in an adaptive control algorithm.

On the other hand, at a notch frequency to be suppressed that is determined from the rotational frequency of the engine, the reference cosine-wave signal is supplied to a transfer element 9 having C0 that simulates the transfer characteristics between the secondary noise generator 8 and the noise suppressor portion. Likewise, the reference sine-wave signal is supplied to a transfer element 10 having C1 that simulates the transfer characteristics between the secondary noise generator 8 and the noise suppressor portion. The resulting output signals from the transfer element 9 and the transfer element 10 are added together at an adder 13 to produce a simulation cosine-wave signal r0, which is in turn supplied together with the error signal "e" to an adaptive control algorithm processor unit 15. The filter coefficient W0 of the adaptive notch filter 4 is successively updated in accordance with an adaptive control algorithm, e.g., the LMS (Least Mean Square) algorithm or a type of the steepest-descent method.

In the same manner, at the notch frequency to be suppressed that is determined from the rotational frequency of the engine, the reference sine-wave signal is supplied to a transfer element 11 having C0 that simulates the transfer characteristics between the secondary noise generator 8 and the noise suppressor portion. Likewise, the reference cosine-wave signal is supplied to a transfer element 12 having –C1 that simulates the transfer characteristics between the secondary noise generator 8 and the noise suppressor portion. The resulting output signals from the transfer element 11 and the transfer element 12 are added together at an adder 14 to produce a simulation sine-wave signal r1, which is in turn supplied together with the error signal "e" to an adaptive control algorithm processor unit 16. The filter coefficient W1 of the adaptive notch filter 4 is successively updated in accordance with an adaptive control algorithm, e.g., the LMS algorithm.

In this manner, the filter coefficients W0 and W1 of the adaptive notch filter 4 converge recursively to an optimum value so as to minimize the error signal "e," i.e., to attenuate the noise in the noise suppressor portion.

However, in the aforementioned conventional active noise control system, since the characteristics of the secondary noise generator may vary with time or the environment in the passenger compartment may vary due to a window being opened or closed or an increase or decrease in the number of passengers, the present transfer characteristics between the output of the adaptive notch filter and the adaptive control algorithm processor unit may have changed from the previous transfer characteristics therebetween available upon determination of the characteristics of a transfer element simulating the previous transfer characteristics. Under these circumstances, the active noise control system may operate causing an unstable operation of the adaptive notch filter. This would not only make it difficult to provide an ideal noise reduction effect but also bring the system into divergence causing a noise to be further increased.

Furthermore, even under the circumstances where there exist a significant amount of incoming external noises while the vehicle is running on unpaved roads or a window is kept open, the system would not properly update the filter coefficients, thereby causing an unstable operation of the adaptive notch filter. In this case, at the worst, it is highly possible that divergence may occur to generate an abnormal acoustic noise causing the passenger to feel extremely uncomfortable. Moreover, in the presence of a difference between the noise level at the noise suppressor portion and that at the ears of a passenger, the system may cause an overcompensated condition in which noises are not properly attenuated at the ears of the passenger.

SUMMARY OF THE INVENTION

The present invention is to overcome the aforementioned problems. It is therefore an object of the present invention to provide an active noise control system, which updates the filter coefficient of an adaptive notch filter with stability while suppressing divergence, and prevents overcompensation to provide passengers with an ideal noise reduction effect. The system is designed to provide these functions even under the situations where the present transfer characteristics between the secondary noise generator and the suppressor portion for suppressing a problematic noise have significantly changed from the previous transfer characteristics therebetween available upon determination of the characteristics of a transfer element simulating the previous transfer characteristics or where there exists a significant amount of incoming external noises.

An active noise control system according to the present invention includes a cosine-wave generator for generating a cosine-wave signal in synchronization with the frequency of a problematic cyclic noise generated at a noise source such as an engine; a sine-wave generator for generating a sine-wave signal in synchronization with the frequency of the problematic noise; a first one-tap adaptive filter for receiving a reference cosine-wave signal or an output signal from the cosine-wave generator; a second one-tap adaptive filter for receiving a reference sine-wave signal or an output signal from the sine-wave generator; an adder for adding together the output signal from the first one-tap adaptive filter and the output signal from the second one-tap adaptive filter; secondary noise generator means, driven by an output signal from the adder, for producing a secondary noise to cancel the problematic noise; residual signal detection means for sensing a residual signal resulting from interference between the secondary noise and the problematic noise; simulation signal generator means for receiving the reference cosine-wave signal and the reference sine-wave signal to generate a simulation cosine-wave signal and a simulation sine-wave signal, the simulation cosine-wave and the sine-wave signals having been compensated in accordance with characteristics simulating transfer characteristics between the secondary noise generator means and the residual signal detection means; and compensated signal generator means for generating a compensated signal obtained by compensating the same signal as the output signal from the adder in accordance with the characteristics simulating the transfer characteristics between the secondary noise generator means and the residual signal detection means, wherein the output signals from the residual signal detection means, the simulation signal generator means, and the compensated signal generator means are used to update the filter coefficients of the first and second one-tap adaptive filters, thereby reducing the problematic noise at the residual signal detection means.

A feature of the aforementioned arrangement is that the filter coefficient of a one-tap adaptive filter is updated in accordance with the output signal from the compensated signal generator means in addition to the output signals from the residual signal detection means and the simulation signal generator means. This feature allows for suppressing overcompensation. Additionally, even when the present transfer characteristics between the secondary noise generator means and the residual signal detection means have significantly changed from the previous transfer characteristics therebetween available upon determination of the characteristics of a transfer element simulating the previous transfer characteristics, the feature also allows for accommodating the amount of the change in accordance with an adaptive control algorithm. It is thus made possible to suppress divergence to provide a noise reduction effect with stability.

Furthermore, the active noise control system according to the present invention may also be designed such that the compensated signal generator means generates a compensated signal obtained by compensating the same signal as the output signal from the adder in accordance with characteristics multiplied by a predetermined constant and simulating the transfer characteristics between the secondary noise generator means and the residual signal detection means. This feature allows for adjusting the level of the compensated signal in response to the rate at which the present transfer characteristics between the secondary noise generator means and the residual signal detection means have changed from the previous transfer characteristics therebetween available upon determination of the characteristics of a transfer element simulating the previous transfer characteristics as well as to the distribution of noise levels in a passenger compartment. It is thus made possible to provide a further optimized suppression to overcompensation and an ideal noise reduction effect with higher stability.

The active noise control system according to the present invention may also be designed such that the compensated signal generator means delivers a compensated signal when at least one of respective cumulative amounts of changes in filter coefficient of the first one-tap adaptive filter and the second one-tap adaptive filter is greater than or equal to a predetermined value, the changes being obtained each time a filter coefficient of each filter is updated during a predetermined interval from a previous to a present point in time. This feature allows for utilizing the compensated signal in an arithmetic operation to update the filter coefficients only when the value of the filter coefficient of a one-tap adaptive filter has greatly changed. It is thus made possible to provide a noise reduction effect with stability while suppressing divergence even when there exist a significant amount of incoming external noises.

Furthermore, the active noise control system according to the present invention may also be designed such that the compensated signal generator means delivers a compensated signal when at least one of respective amounts of a change in filter coefficient of the first one-tap adaptive filter and the second one-tap adaptive filter is greater than or equal to a predetermined value, the change in filter coefficient of each filter being a difference between a present value and a previous value at a predetermined time interval past. This feature allows for more readily determining the amount of change in filter coefficient and for providing a simplified arithmetic algorithm, which in turn facilitates creating of programs.

While novel features of the invention are set forth in the preceding, the invention, both as to organization and content, can be further understood and appreciated, along with other objects and features thereof, from the following detailed description and examples when taken in conjunction with the attached drawings.

DETAILED DESCRIPTION OF THE PREFERRED EMBODIMENTS

First Embodiment

Figure 1:
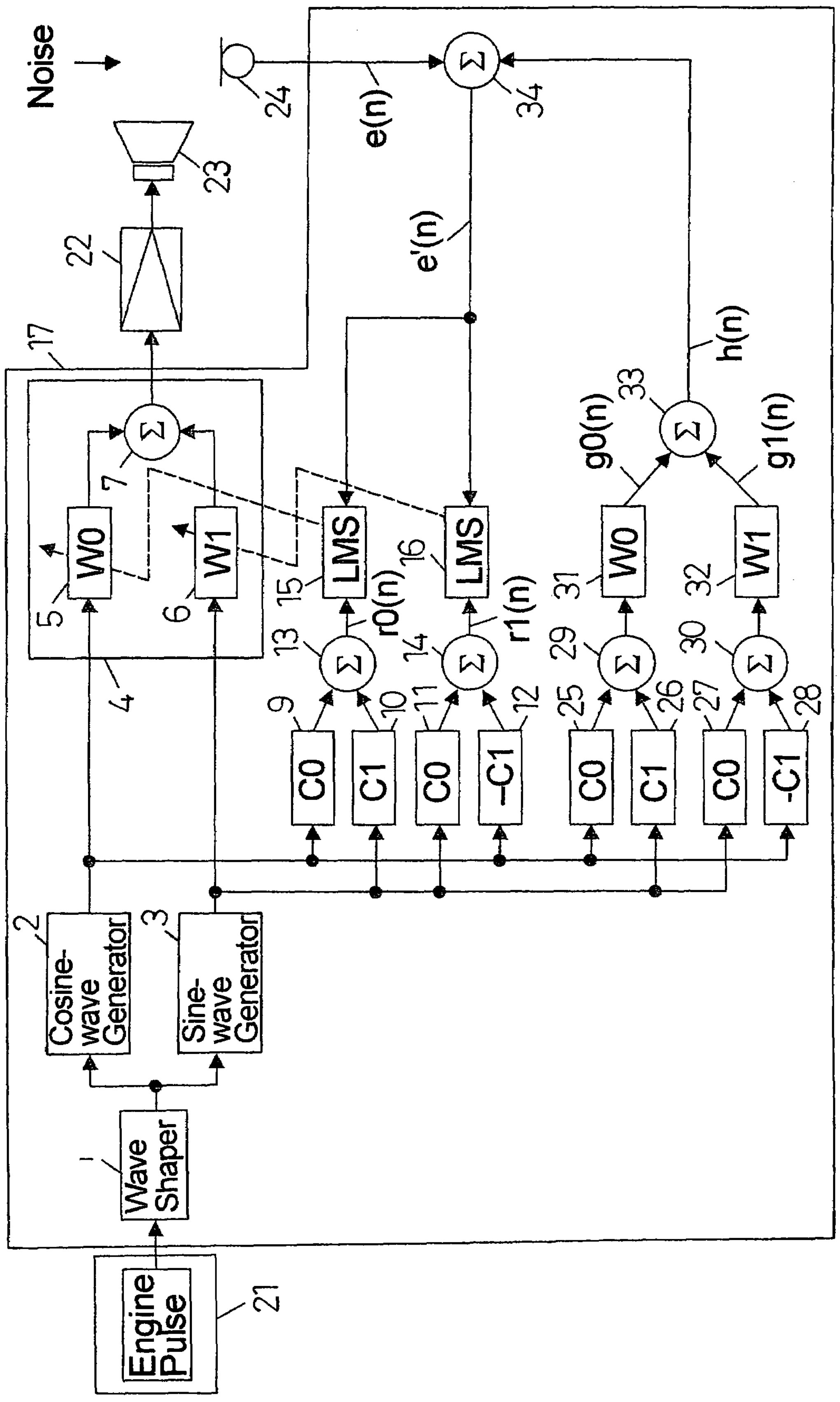
FIG. 1 is a block diagram illustrating the configuration of an active noise control system according to a first embodiment of the present invention.

Now, the present invention will be explained below in more detail with reference to the accompanying drawings in accordance with the embodiments. In the drawings, the same components as those of the conventional active noise control system described in relation to the related art are indicated by the like reference symbols. By way of example, the present invention will be described in accordance with an active noise control system incorporated into a vehicle to reduce a vibrational noise in the passenger compartment caused by the operation of the engine.

FIG. 1 illustrates in a block diagram form the configuration of an active noise control system according to the first embodiment. Referring to FIG. 1, with an engine 21 being a noise source that generates a problematic noise, the active noise control system operates to reduce a periodic vibrational noise radiated by the engine 21.

An engine pulse or an electric signal synchronous with the rotation of the engine 21 is supplied to the wave shaper 1, where a noise or the like superimposed on the engine pulse is removed while the engine pulse is shaped. As the engine pulse, a TDC (top dead center) sensor output signal or a tachometer pulse may be conceivably used. Particularly, the tachometer pulse, which is already employed in a vehicle in many cases as an input signal to the tachometer, requires no additional arrangement to be separately provided thereto.

The output signal from the wave shaper 1 is added to the cosine-wave generator 2 and the sine-wave generator 3 to create a cosine wave and a sine wave serving as a reference signal in synchronization with a notch frequency to be cancelled that is determined from the rotational frequency of the engine 21 (hereinafter simply referred to as the notch frequency). The reference cosine-wave signal or an output signal from the cosine-wave generator 2 is multiplied by a filter coefficient W0 of a first one-tap adaptive filter 5 in an adaptive notch filter 4. Similarly, the reference sine-wave signal or an output signal from the sine-wave generator 3 is multiplied by a filter coefficient W1 of a second one-tap adaptive filter 6 in the adaptive notch filter 4. The output signal from the first one-tap adaptive filter 5 and the output signal from the second one-tap adaptive filter 6 are added together at an adder 7, which in turn supplies the resulting output signal to a power amplifier 22 and a speaker 23, which serve as the secondary noise generator means.

The output signal from the adder 7 or an output from the adaptive notch filter 4 is power amplified at the power amplifier 22, and then radiated from the speaker 23 as a secondary noise for canceling the problematic noise. At this time, a residual signal that remains from interference between the secondary noise and the problematic noise in a noise suppressor portion is sensed by means of a microphone 24 serving as residual signal detection means and employed as an error signal "e" in an adaptive control algorithm for updating the filter coefficients W0 and W1 of the adaptive notch filter 4.

The simulation signal generator means for simulating the transfer characteristics between the power amplifier 22 and the microphone 24 at the notch frequency (hereinafter simply referred to as the transfer characteristic) includes transfer elements 9, 10, 11, and 12, and adders 13, 14. First, the reference cosine-wave signal is supplied to the transfer element 9, and as well the reference sine-wave signal is supplied to the transfer element 10. Then, the resulting output signals from the transfer elements 9 and 10 are added together at the adder 13 to produce a simulation cosine-wave signal r0. The simulation cosine-wave signal r0 is then supplied to an adaptive control algorithm processor unit 15 and used in an adaptive control algorithm for updating the filter coefficient W0 of the first one-tap adaptive filter 5. In the same manner, the reference sine-wave signal is supplied to the transfer element 11, and as well the reference cosine-wave signal is supplied to the transfer element 12. The resulting output signals from the transfer elements 11 and 12 are added together at the adder 14 to produce a simulation sine-wave signal r1. The simulation sine-wave signal r1 is then supplied to an adaptive control algorithm processor unit 16 and used in an adaptive control algorithm for updating the filter coefficient W1 of the second one-tap adaptive filter 6.

Figure 2:
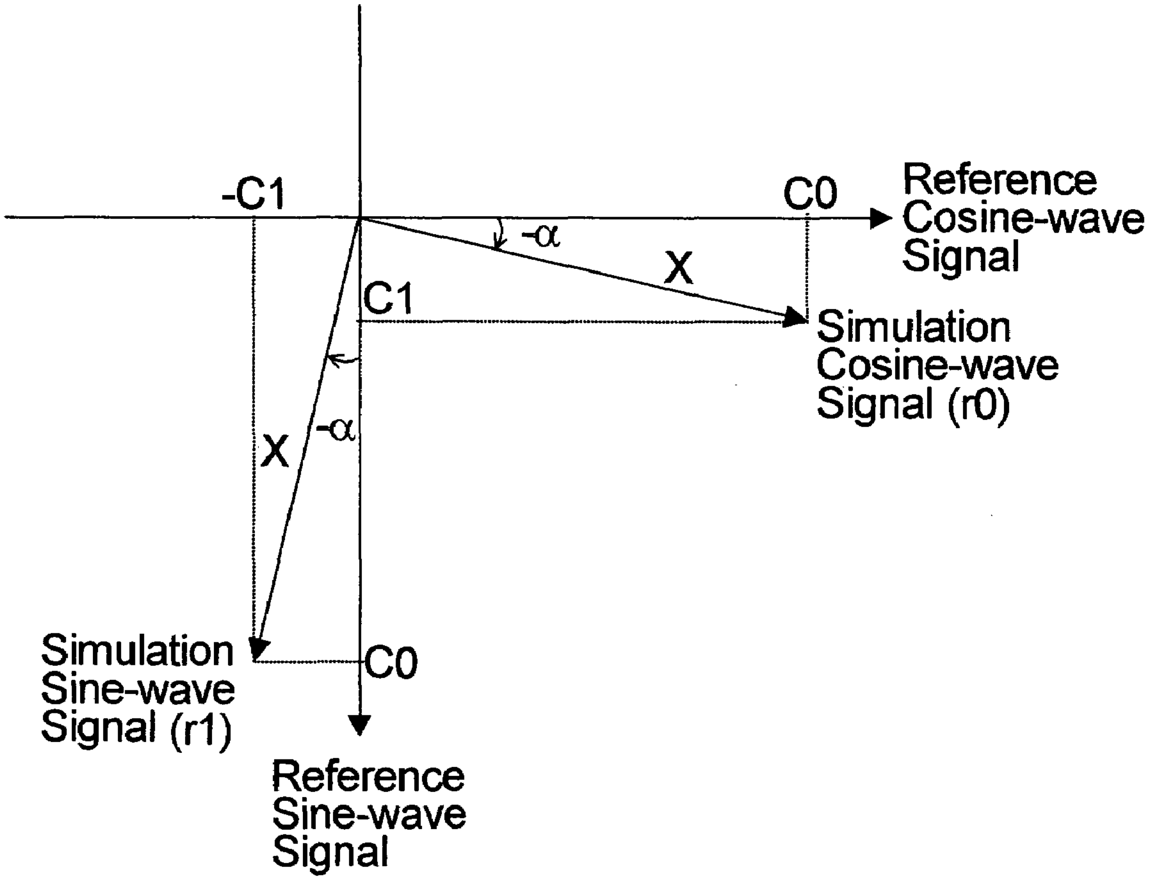
FIG. 2 is a view illustrating simulation cosine-wave and sine-wave signals according to the first embodiment.

Referring to FIG. 2, a description is given to how to generate the simulation cosine-wave signal r0 and the simulation sine-wave signal r1 using the reference cosine-wave and sine-wave signals, and the transfer elements 9, 10, 11, and 12, as described above. Assume that at the notch frequency, the transfer characteristics available upon providing settings to the transfer elements 9, 10, 11, and 12 are of gain X and phase −α (deg) (which are hereinafter referred to as the initial transfer characteristic). In this case, it is readily understood that the settings of the transfer elements 9, 10, 11, and 12 should be provided as shown in FIG. 2 in order to generate the simulation cosine-wave signal r0 and the simulation sine-wave signal r1, which simulate the initial transfer characteristics, using the combination of the reference cosine-wave signal and the reference sine-wave signal, which are orthogonal to each other. That is, the transfer elements 9, 10, 11, and 12 are provided with settings of C0, C1, C0, and −C1, respectively.

In general, as described in relation to the related art, the LMS (Least Mean Square) algorithm or a type of the steepest-descent method is employed as an adaptive control algorithm to update the filter coefficients W0 and W1 of the adaptive notch filter 4. The filter coefficients W0(n+1) and W1(n+1) of the adaptive notch filter 4 are determined by the following equations:

$$W0(n+1)=W0(n)-\mu e(n)r0(n) \quad (1), \text{ and}$$

$$W1(n+1)=W1(n)-\mu e(n)r1(n) \quad (2),$$

where μ is the step size parameter.

As in the foregoing, the filter coefficients W0 and W1 of the adaptive notch filter 4 converge recursively to an optimum value so as to minimize the error signal "e," i.e., to reduce noise at the microphone 24 serving as the noise suppressor portion.

Figure 3:
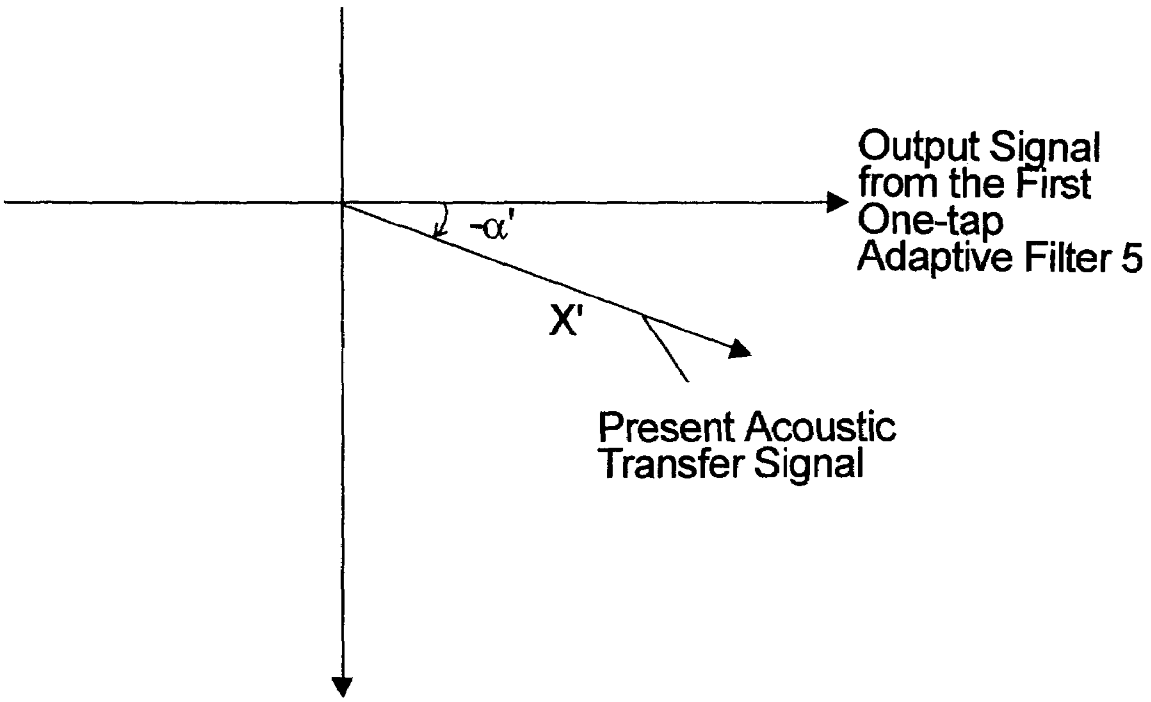
FIG. 3 is a view illustrating a present acoustic transfer signal (of gain X' and phase $-\alpha'$) according to the first embodiment.

A general approach based on the aforementioned LMS algorithm is valid when no change occurs in transfer characteristics. For example, the initial transfer characteristics may slightly change to the present transfer characteristics of gain X' and phase $-\alpha'$ (deg). FIG. 3 shows a signal (the present acoustic transfer signal) available for acoustically transferring the output from the first one-tap adaptive filter 5 to the microphone 24 in accordance with the present transfer characteristics. FIG. 3 shows a representation with respect to the output signal from the first one-tap adaptive filter 5 to which the reference cosine-wave signal is supplied. This representation is intended to facilitate comparison with the simulation cosine-wave signal r0 of FIG. 2, and will also be employed in the other figures. As seen from FIGS. 2 and 3, it is said that the phase characteristics of the simulation cosine-wave signal r0 and the present acoustic transfer signal are slightly different from each other but approximately equal to each other. Under these circumstances, the active noise control system provides the noise reduction effect with stability.

Figure 4:
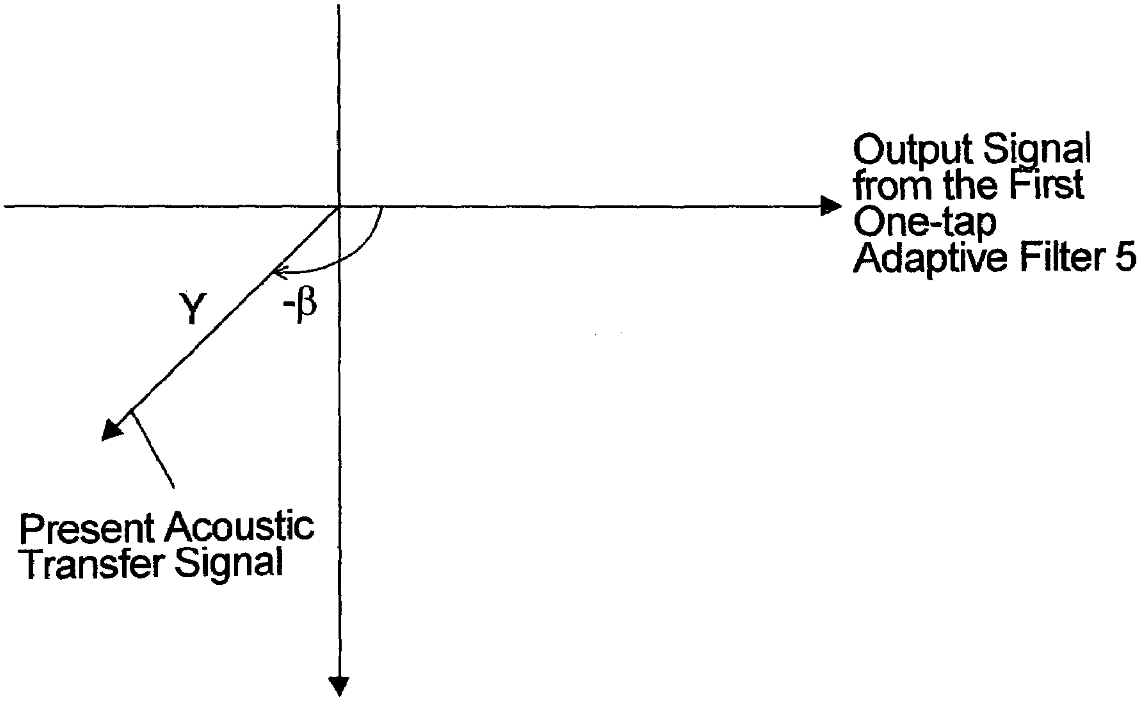
FIG. 4 is a view illustrating a present acoustic transfer signal (of gain Y and phase $-\beta$) according to the first embodiment.

However, under actual service environments of the active noise control system, the characteristics of the speaker 23 and the microphone 24 may often vary with time or the transfer characteristics may greatly vary due to a change in the number of passengers in the passenger compartment or a window being closed or opened and so on. In these cases, especially when the phase characteristic changes greatly from that of the initial transfer characteristics, no stable adaptive control is provided. In particular, when the present transfer characteristics have changed in phase characteristic from the initial transfer characteristics by 90 (deg) or more, the secondary noise radiated from the speaker 23 would even amplify noises, thereby possibly causing the adaptive notch filter 4 to diverge. For example, the initial transfer characteristics may change to the present transfer characteristics of gain Y and phase $-\beta$ (deg). FIG. 4 shows a signal (the present acoustic transfer signal) available for acoustically transferring the output from the first one-tap adaptive filter 5 to the microphone 24 in accordance with the present transfer characteristics. As seen from FIGS. 2 and 4, the phase characteristics of the simulation cosine-wave signal r0 and the present acoustic transfer signal are greatly different from each other. The phase, $-\beta$ (deg), of the present transfer characteristics has changed from the phase, $-\alpha$ (deg), of the initial transfer characteristics by 90 (deg) or more. Under these circumstances, when the filter coefficients W0 and W1 of the adaptive notch filter 4 are updated in accordance with the LMS algorithm shown in equations (1) and (2), there is a high possibility that divergence will result.

In this context, it is necessary to keep the adaptive notch filter 4 operable with stability to prevent abnormal operations such as divergence even in the presence of a significant change in the present transfer characteristics from the initial transfer characteristics.

The first embodiment mathematically produces a signal available for acoustically transferring the output from the adaptive notch filter 4 to the microphone 24 in accordance with the initial transfer characteristics, and employs the signal as a compensated signal. The compensated signal and the output signal from the microphone 24 are added together to produce a signal, which is in turn used in an adaptive control algorithm. This allows for operationally reducing a change in transfer characteristics, especially a change in the phase characteristic that has a significant effect on stability, to suppress the divergence of the adaptive notch filter 4 thereby providing a stable noise reduction effect.

The compensated signal generator means for generating the aforementioned compensated signal includes transfer elements 25, 26, 27, and 28, adders 29, 30, and 33, and coefficient multipliers 31, 32. First, the reference cosine-wave signal is supplied to the transfer element 25 having C0 that simulates the initial transfer characteristics at the notch frequency and as well the reference sine-wave signal is supplied to the transfer element 26 having C1, to add the output signals from the transfer elements 25 and 26 together at the adder 29.

Subsequently, the output signal from the adder 29 is multiplied by the filter coefficient W0 of the adaptive notch filter 4 at the coefficient multiplier 31 to produce a compensated cosine-wave signal g0. Likewise, the reference sine-wave signal is supplied to the transfer element 27 having C0 that simulates the initial transfer characteristics and as well the reference cosine-wave signal is supplied to the transfer element 28 having −C1, to add the output signals from the transfer elements 27 and 28 together at the adder 30. Subsequently, the output signal from the adder 30 is multiplied by the filter coefficient W1 of the adaptive notch filter 4 at the coefficient multiplier 32 to produce a compensated sine-wave signal g1. The aforementioned compensated cosine-wave and sine-wave signals g0 and g1 are added together at the adder 33 to provide a compensated signal "h." The compensated signal "h" is a mathematically determined signal available for acoustically transferring the output from the adaptive notch filter 4 to the microphone 24 in accordance with the initial transfer characteristics. The compensated cosine-wave signal g0 is equivalent to a signal available for acoustically transferring the output from the first one-tap adaptive filter 5 to the microphone 24 in accordance with the initial transfer characteristics. Similarly, the compensated sine-wave signal g1 is equivalent to a signal available for acoustically transferring the output from the second one-tap adaptive filter 6 to the microphone 24 in accordance with the initial transfer characteristics.

Next, the compensated signal "h" and the output signal (the error signal "e") from the microphone 24 are added together at an adder 34 to produce a signal, which is in turn supplied to the adaptive control algorithm processor units 15 and 16, for use in the adaptive control algorithm to update the filter coefficients W0 and W1 of the adaptive notch filter 4.

Assuming that the compensated signal "h" and the error signal "e" are added together to produce a compensated error signal "e'," the compensated error signal "e'" is expressed by the following equation:

$$e'(n)=e(n)+h(n) \tag{3}$$

When the compensated error signal "e'," the simulation cosine-wave signal r0, and the simulation sine-wave signal r1 are employed in the LMS algorithm, the filter coefficients W0(n+1) and W1(n+1) of the adaptive notch filter 4 are determined by the following equations:

$$W\mathbf{0}(n+1)=W\mathbf{0}(n)-\mu e'(n)r\mathbf{0}(n) \tag{4}$$

$$W\mathbf{1}(n+1)=W\mathbf{1}(n)-\mu e'(n)r\mathbf{1}(n) \tag{5}$$

where $\mu$ is the step size parameter.

As seen in the foregoing, the filter coefficients W0 and W1 of the adaptive notch filter 4 converge recursively to an optimum value so as to minimize the error signal "e'," i.e., to reduce noise at the microphone 24 serving as the noise suppressor portion. The compensated signal "h" being used in the LMS algorithm means that the compensated cosine-wave signal g0 is used to update the filter coefficient W0 of the first one-tap adaptive filter 5 and the compensated sine-wave signal g1 is used to update the filter coefficient W1 of the second one-tap adaptive filter 6. This can be understood from equations (4) and (5).

Figure 5:
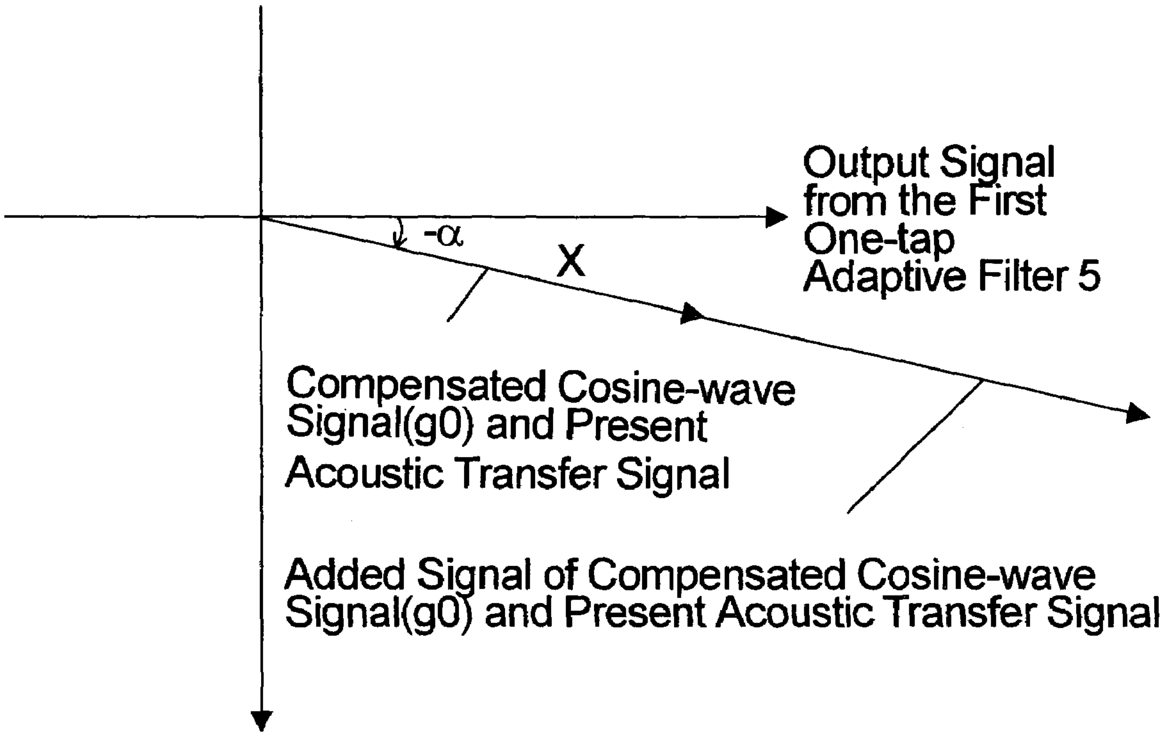
FIG. 5 is a view illustrating a present acoustic transfer signal (of gain X and phase −α), a compensated cosine-wave signal, and an added signal of these two signals, according to the first embodiment.
Figure 6:
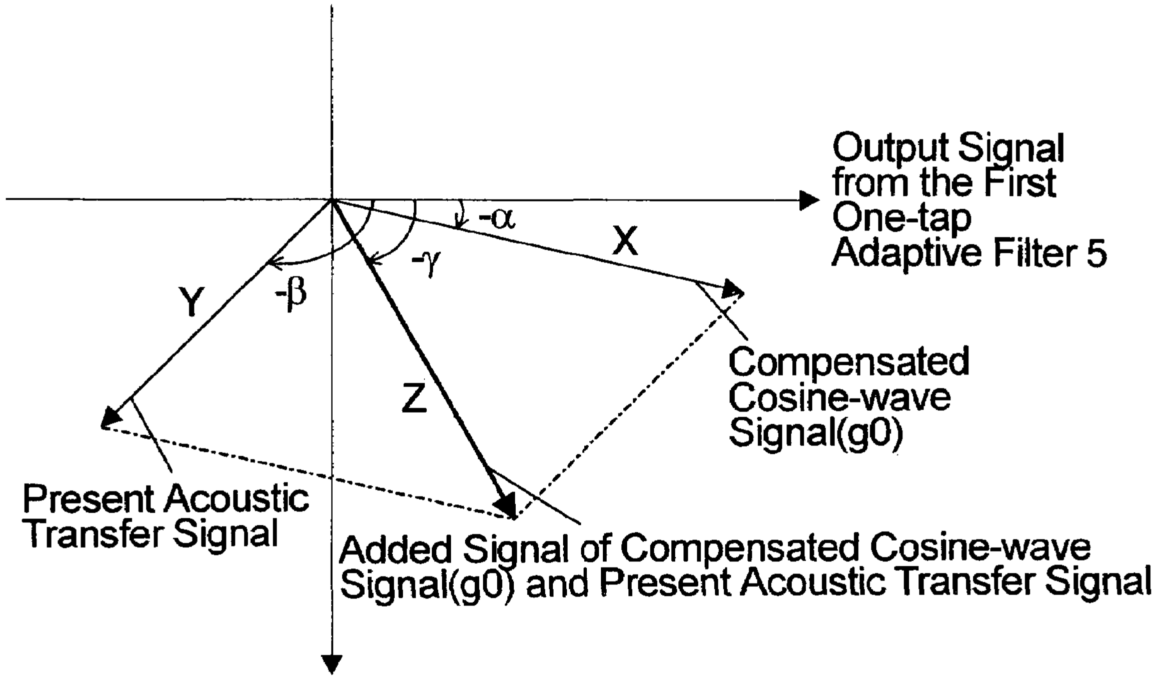
FIG. 6 is a view illustrating a present acoustic transfer signal (of gain Y and phase −β), a compensated cosine-wave signal, and an added signal of these two signals, according to the first embodiment.

Now, referring to FIGS. 5 and 6, described is the compensated error signal "e'" shown in equation (3) being used in the adaptive control algorithm. First, by way of example, with the present transfer characteristics having not changed at all from the initial transfer characteristics to remain of gain X and phase −α (deg), FIG. 5 shows the compensated cosine-wave signal g0, a signal (the present acoustic transfer signal) available for acoustically transferring the output from the first one-tap adaptive filter 5 to the microphone 24 in accordance with the present transfer characteristics, and an added signal of these two signals. As seen from FIGS. 2 and 5, the simulation cosine-wave signal r0 and the added signal are equal to each other in phase characteristic. Accordingly, when the present transfer characteristics have not changed at all from the initial transfer characteristics, the added signal can be also used in the adaptive control algorithm to update the filter coefficient W0 of the adaptive notch filter 4, thereby allowing the active noise control system to provide the noise reduction effect with stability in the same manner as with the general LMS algorithm.

However, the LMS algorithm shown in equations (4) and (5) above works to reduce the compensated error signal "e'" to zero, and thus tends to provide a less amount of noise reduction when compared with the general LMS algorithm shown in equations (1) and (2). This will be discussed in more detail below. As in the forgoing, the present transfer characteristics are assumed to have not changed at all from the initial transfer characteristics. Letting N be the problematic noise from the engine 21, the error signal "e" is the sum of the noise N and a signal available for acoustically transferring the output from the adaptive notch filter 4 to the microphone 24 in accordance with the present transfer characteristics. Furthermore, In this case, since the signal available for acoustically transferring the output from the adaptive notch filter 4 to the microphone 24 in accordance with the present transfer characteristics is equal to the compensated signal "h" that has been produced mathematically, $$e(n)=N(n)+h(n) \tag{6}$$

Therefore, e'(n) can be expressed as follows:

$$e'(n) = \{N(n) + h(n)\} + h(n) \tag{7}$$

$$= N(n) + 2 \cdot h(n) \tag{8}$$

Since the LMS algorithm shown in equations (4) and (5) works to reduce e'(n) to zero, $$N(n)+2\cdot h(n)=0 \tag{9}$$

$$\text{Therefore, } h(n)=-N(n)/2 \tag{10}$$

Equation (10) shows that the signal available for acoustically transferring the output from the adaptive notch filter 4 to the microphone 24 in accordance with the present transfer characteristics is opposite in phase with the noise N and has one-half the amplitude of the noise N. In other words, this means that the problematic noise is reduced only to a half at maximum at the microphone 24 serving as the noise suppressor portion. This may seem to provide a reduced effect from the viewpoint of the amount of noise reduction; however, this provides effective means available when the active noise control system is actually incorporated into a vehicle or the like.

The reasons for this are as described below. In practical service environments, the microphone 24 is often located apart from the ears of a passenger, e.g., on the reverse of the instrument panel or under the seats. At these locations, the sound pressure level of noise is often overwhelmingly higher than that at the ears of the passenger. In such cases, an attempt to reduce the noise level at the microphone 24 to zero in accordance with the general LMS algorithm shown in equations (1) and (2) would cause overcompensation at the ears of the passenger, resulting in the noise reduction effect being reduced or even an increase in the noise.

On the other hand, the LMS algorithm shown in equations (4) and (5) would not reduce the noise to zero at the microphone 24; however, this would suppress overcompensation providing a sufficient noise reduction effect at the ears of the passenger.

Now, by way of example, with the initial transfer characteristics having changed to the present transfer characteristics of gain Y and phase −β (deg), FIG. 6 shows the compensated cosine-wave signal g0, a signal (the present acoustic transfer signal) available for acoustically transferring the output from the first one-tap adaptive filter 5 to the microphone 24 in accordance with the present transfer characteristics, and an added signal of these two signals. As seen from FIGS. 2 and 6, the simulation cosine-wave signal r0 and the present acoustic transfer signal are significantly different from each other in phase characteristic. Here, the phase of the present transfer characteristics, −β (deg), has changed from that of the initial transfer characteristics, −α (deg), by 90 (deg) or more.

Under these circumstances, using the general LMS algorithm shown in equations (1) and (2) would possibly cause divergence in the adaptive notch filter 4. Now, pay attention to the added signal of the compensated cosine-wave signal g0 and the present acoustic transfer signal. From FIGS. 2 and 6, the phase of the added signal, −γ (deg), is appreciably closer to the phase of the simulation cosine-wave signal r0, −α (deg), when compared with the phase of the present acoustic transfer signal, −β (deg).

Accordingly, the added signal is used in the adaptive control algorithm to update the filter coefficient W0 of the adaptive notch filter 4, thereby providing significantly enhanced control stability. From the viewpoint of the adaptive control algorithm, a more than 90 (deg) actual phase difference between the present transfer characteristics and the initial transfer characteristics is improved to be 90 (deg) or less using the added signal of the compensated cosine-wave signal g0 and the present acoustic transfer signal, thereby significantly reducing the risk of divergence. Accordingly, even when the present transfer characteristics change significantly from the initial transfer characteristics in this way, the active noise control system provides a stable noise reduction effect.

As described above, the active noise control system according to the first embodiment is designed to mathematically generate a signal available for acoustically transferring the output from the adaptive notch filter to the microphone in accordance with the initial transfer characteristics, and add this signal and the output signal from the microphone together to use the resulting signal in an adaptive control algorithm. This allows the system to suppress overcompensation as well as the adaptive algorithm to accommodate a change in the present transfer characteristics from the initial transfer characteristics, thereby suppressing divergence to provide a stabilized noise reduction effect.

Second Embodiment

In accordance with the aforementioned first embodiment, described was that the added signal of the compensated signal "h" and the output signal (error signal "e") from the microphone 24 is used in an adaptive control algorithm to update the filter coefficients W0 and W1 of the adaptive notch filter 4, thereby suppressing overcompensation and providing enhanced control stability. In the second embodiment, a description will be further made to a technique for controlling the amount of suppression of overcompensation.

Figure 7:
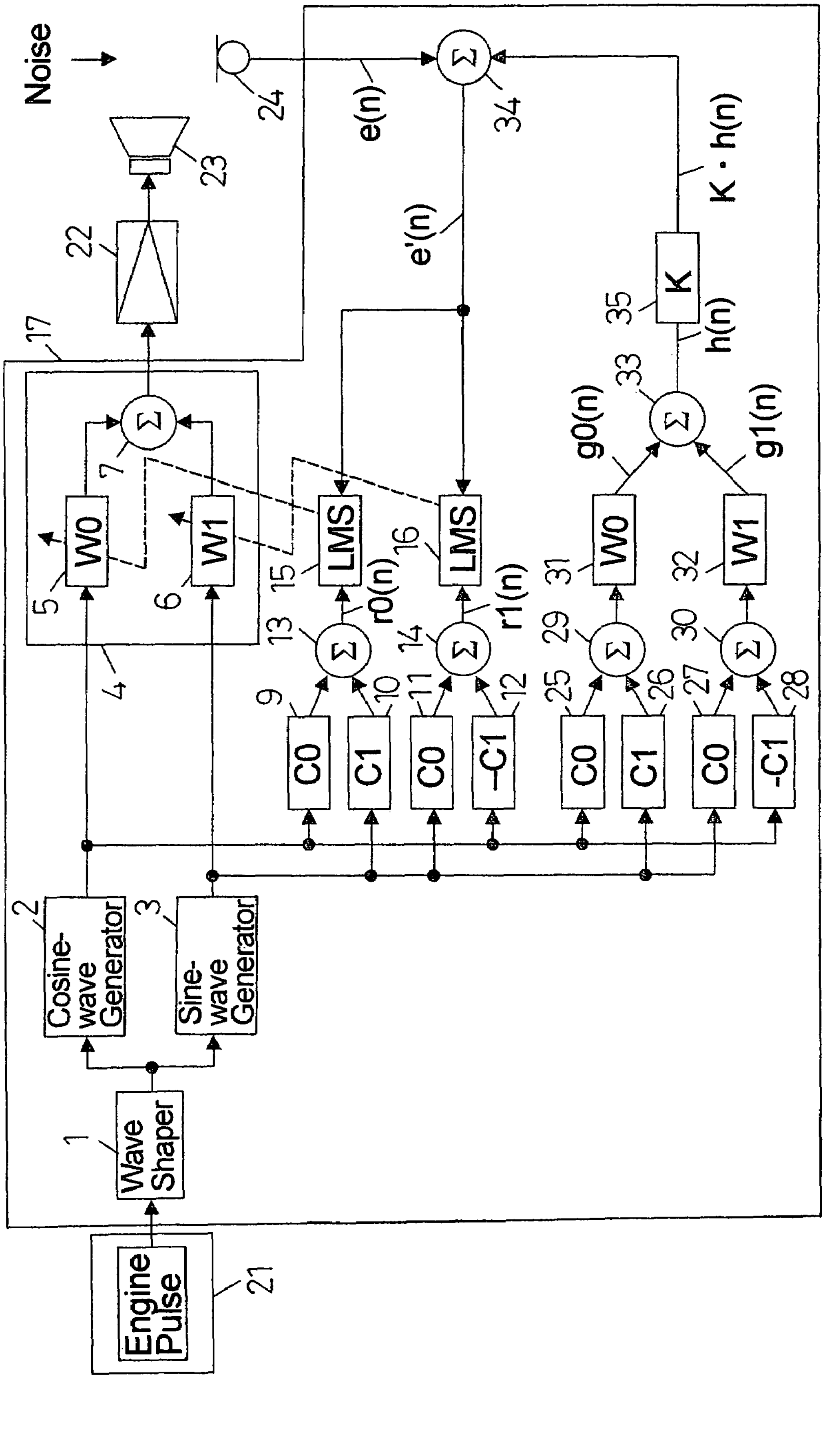
FIG. 7 is a block diagram illustrating the configuration of an active noise control system according to a second embodiment of the present invention.

FIG. 7 illustrates in a block diagram form the configuration of an active noise control system according to the second embodiment. In the figure, the same components as those of the active noise control system shown in the first embodiment are indicated by the like reference symbols.

FIG. 7 is different from FIG. 1 in that the compensated signal generator means is provided with a coefficient multiplier 35. With this arrangement, the compensated signal "h" or an output signal from the adder 33 is supplied to the coefficient multiplier 35, where it is multiplied by a coefficient K. The resulting output signal K·h from the coefficient multiplier 35 and the output signal (error signal "e") from the microphone 24 are added together at the adder 34 to produce a signal, which is in turn supplied to the adaptive control algorithm processor units 15, 16 and then used in an adaptive control algorithm to update the filter coefficients W0 and W1 of the adaptive notch filter 4.

The compensated signal K·h produced by the compensated signal "h" being multiplied by the coefficient K at the coefficient multiplier 35 is now defined as a new compensated signal, and the added signal of the new compensated signal and the error signal "e" is defined as a new compensated error signal "e'." In this case, the compensated error signal "e'" is expressed by the following equation:

$$e'(n)=e(n)+K\cdot h(n) \quad (11)$$

The new compensated error signal "e'," the simulation cosine-wave signal r0, and the simulation sine-wave signal r1 are applied to the aforementioned LMS algorithm shown in equations (4) and (5) to allow the filter coefficients W0 and W1 of the adaptive notch filter 4 to converge to an optimum value so as to minimize the compensated error signal "e'," thereby reducing noise at the microphone 24. The use of the new compensated signal K·h in the LMS algorithm means that K·g0 obtained by the compensated cosine-wave signal g0 being multiplied by the coefficient K is used to update the filter coefficient W0 of the first one-tap adaptive filter 5, and as well K·g1 obtained by the compensated sine-wave signal g1 being multiplied by the coefficient K is used to update the filter coefficient W1 of the second one-tap adaptive filter 6. This can be understood from equations (4) and (5).

Now, the amount of noise reduction effect provided here will be explained below. As in the first embodiment, assume that the present transfer characteristics have not changed at all from the initial transfer characteristics. Letting N be the problematic noise from the engine 21, equations (6) and (11) can be changed as follows:

$$e'(n)=\{N(n)+h(n)\}+K\cdot h(n) \quad (12)$$

$$=N(n)+(1+K)\cdot h(n) \quad (13)$$

Since the LMS algorithm shown in equations (4) and (5) works to reduce e'(n) to zero, $$N(n)+(1+K)\cdot h(n)=0 \quad (14)$$

$$\text{Therefore, } h(n)=-N(n)/(1+K) \quad (15)$$

Equation (15) shows that the signal available for acoustically transferring the output from the adaptive notch filter 4 to the microphone 24 in accordance with the present transfer characteristics is opposite in phase with the noise N and has 1/(1+K) the amplitude of the noise N. In other words, this means that the coefficient K of the coefficient multiplier 35 is adjusted, thereby providing control to the amount of a noise reduction effect at the microphone 24 serving as the noise suppressor portion. That is, the value of the coefficient K is adjusted in response to the difference between the sound pressure level of a noise at the microphone 24 and that of a noise at the ears of a passenger, thereby providing a further optimized suppression to overcompensation. It is also made possible to adjust the value of the coefficient K in response to the rate of change between the present transfer characteristics and the initial transfer characteristics, thereby providing further optimized control stability.

Figure 8:
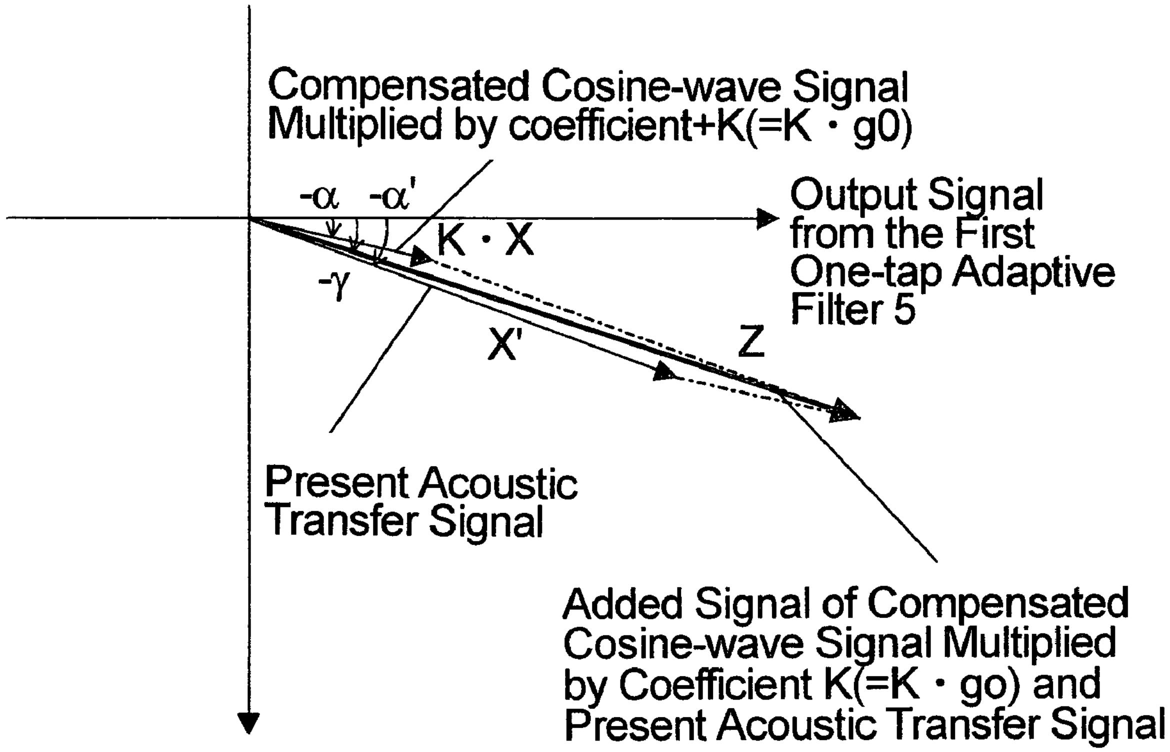
FIG. 8 is a view illustrating a present acoustic transfer signal (of gain X' and phase −α'), a compensated cosine-wave signal multiplied by a coefficient, and an added signal of these two signals, according to the second embodiment.

This will be explained with reference to FIG. 8. For example, suppose that the initial transfer characteristics have slightly changed to the present transfer characteristics of gain X' and phase −α' (deg). FIG. 8 shows a signal (the present acoustic transfer signal) available for acoustically transferring the output from the first one-tap adaptive filter 5 to the microphone 24 in accordance with the present transfer characteristics, the compensated cosine-wave signal g0 multiplied by the coefficient K to obtain a compensated cosine-wave signal K·g0, and an added signal of these two signals. Here, the coefficient K is set at a value of one or less. This makes it possible to provide a further optimized amount of suppression of overcompensation in accordance with the gain Z of the added signal as well as to change the phase characteristic that is now −α' (deg) to −γ (deg), thereby providing improved stability.

As described above, the active noise control system according to the second embodiment is designed such that an added signal of the compensated signal "h" multiplied by the coefficient K and the output signal (error signal "e") from the microphone 24 is employed in an adaptive control algorithm. This allows the system to generate a further optimized compensated signal in response to the rate of change in the present transfer characteristics from the initial transfer characteristics or the difference between the noise level at the microphone 24 and that at the ears of a passenger, thereby providing an ideal noise reduction effect with higher stability.

Third Embodiment

Figure 9:
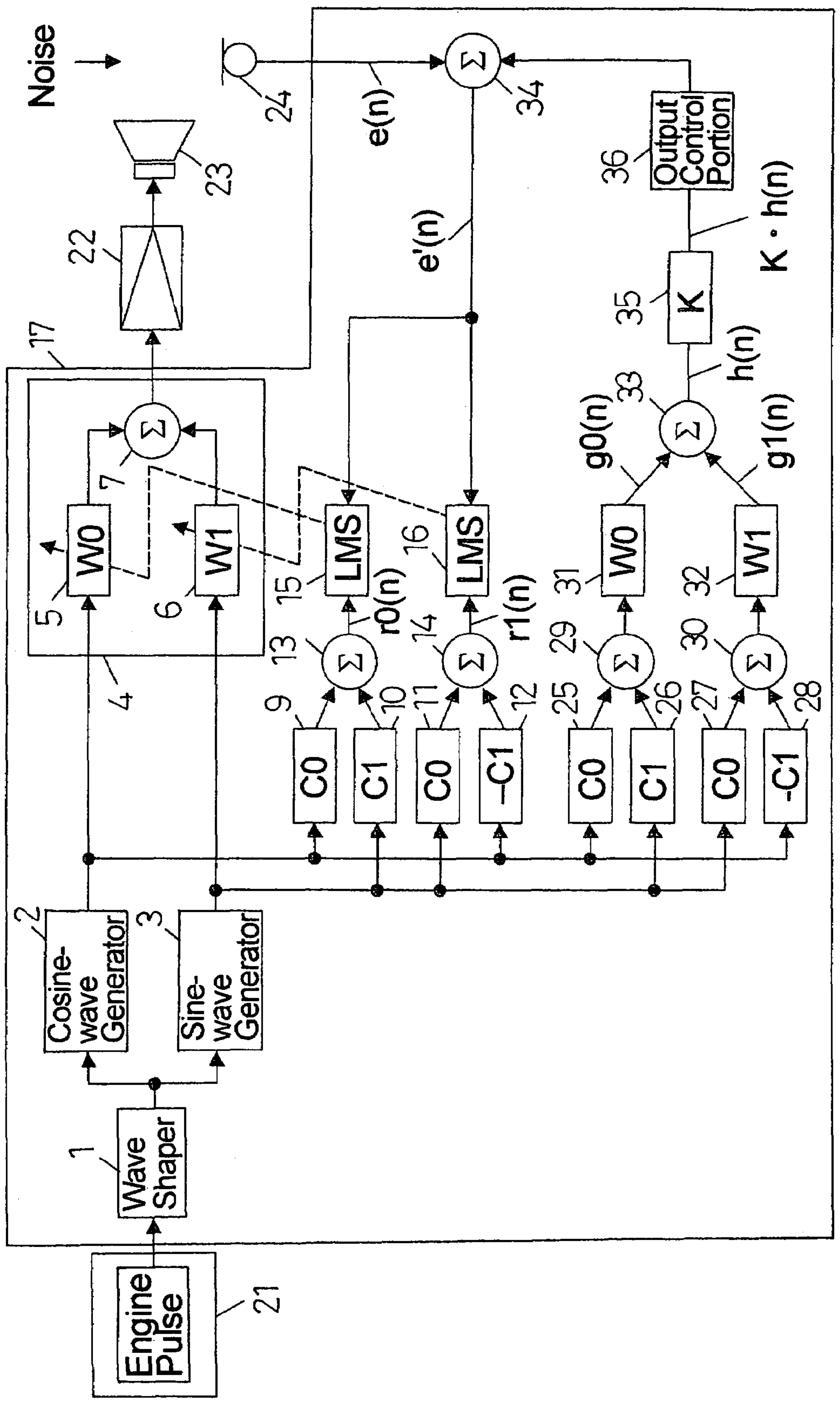
FIG. 9 is a block diagram illustrating the configuration of an active noise control system according to a third embodiment of the present invention.
Figure 10:
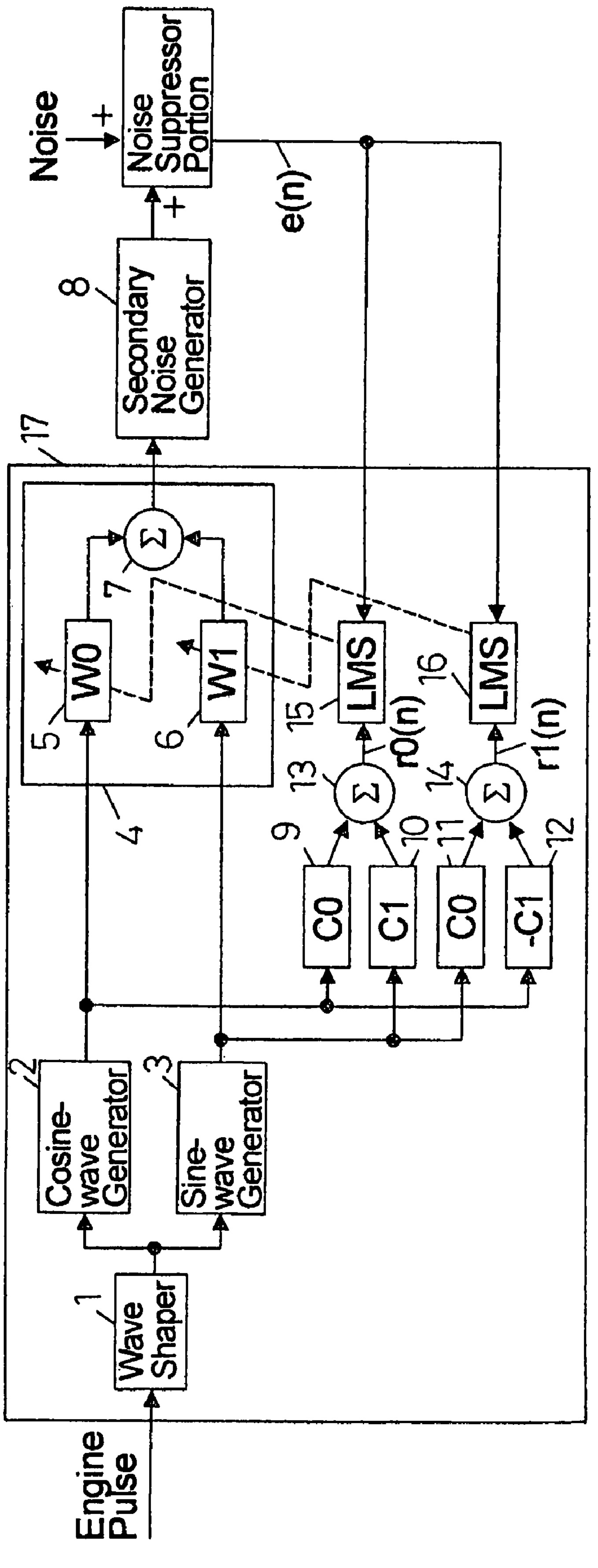
Fig. 10 PRIOR ART
FIG. 10 is a block diagram illustrating the configuration of a conventional active noise control system.

FIG. 9 illustrates in a block diagram form the configuration of an active noise control system according to the third embodiment. In the figure, the same components as those of the active noise control systems shown in the first and second embodiments are indicated by the like reference symbols.

FIG. 9 is different from FIG. 7 in that the compensated signal generator means is provided with an output control portion 36. With this arrangement, an output signal K·h from the coefficient multiplier 35 is supplied to the output control portion 36. The output control portion 36 includes a storage area for storing the values of the filter coefficient W0 of the first one-tap adaptive filter 5 each time the filter coefficient W0 is updated during a predetermined interval from a previous to the present point in time (e.g., an interval during which the filter coefficient is updated 20 times). The output control portion 36 calculates a cumulative amount of the changes. Similarly, the output control portion 36 also includes another storage area for storing the values of the filter coefficient W1 of the second one-tap adaptive filter 6 each time the filter coefficient W1 is updated during a predetermined interval from a previous to the present point in time (e.g., an interval during which the filter coefficient is updated 20 times). The output control portion 36 calculates a cumulative amount of the changes. Only when at least one of these cumulative amounts is greater than a predetermined threshold, the output control portion 36 delivers the output signal K·h supplied from the coefficient multiplier 35 thereto. This is implemented at the discrete-computation processor unit 17 by means of a memory and program.

In practice, when a vehicle incorporating the active noise control system runs on unpaved roads or while a window is kept open, the adaptive control algorithm is subject to the effects of external noises thereby providing unstable control. For example, the microphone 24 installed near the ears of a passenger in the passenger compartment would be significantly subjected to external noises such as road noises and wind pressure or wind noises coming through a window into the passenger compartment. At this time, the filter coefficients W0 and W1 of the adaptive notch filter 4 would be significantly varied, causing divergence at the worst. In this context, the output control portion 36 is provided to monitor the cumulative amounts of changes in the filter coefficients W0 and W1 of the adaptive notch filter 4 during a predetermined interval from a previous to the present point in time. This allows for properly monitoring the behavior of the adaptive notch filter 4. When one of these cumulative amounts exceeds a predetermined threshold, the process determines that the adaptive control has become unstable due to the effects of external noises, and uses a compensated signal in the adaptive control algorithm to improve stability.

As described above, the active noise control system according to the third embodiment is designed to monitor the cumulative amounts of changes in the filter coefficients W0 and W1 of the adaptive notch filter 4, and add a compensated signal to the adaptive control algorithm only when the cumulative amount has exceeded a threshold. This makes it possible to provide an ideal noise reduction effect with stability while suppressing divergence even under the circumstances where there exists a significant amount of incoming external noises.

In the foregoing, the output control portion 36 shown in the third embodiment employs the cumulative amounts of changes in the filter coefficients W0 and W1 of the adaptive notch filter 4 during a predetermined interval from a previous to the present point in time. However, it is also acceptable to employ the amounts of a change in each of the filter coefficients W0 and W1 of the adaptive notch filter 4 between the present value and a previous value at a predetermined time interval past. In this case, the output control portion 36 includes a storage area for storing the values of the filter coefficient W0 of the first one-tap adaptive filter 5 each time the filter coefficient W0 is updated during a predetermined interval from a previous to the present point in time (e.g., an interval during which the filter coefficient is updated 20 times). The output control portion 36 calculates the amount of a change between the present value and a previous value at a predetermined time interval past. Similarly, the output control portion 36 also includes another storage area for storing the values of the filter coefficient W1 of the second one-tap adaptive filter 6 each time the filter coefficient W1 is updated during a predetermined interval from a previous to the present point in time (e.g., an interval during which the filter coefficient is updated 20 times). The output control portion 36 calculates the amount of a change between the present value and a previous value at a predetermined time interval past. Only when at least one of these amounts of change is greater than a predetermined threshold, the output control portion 36 delivers the output signal K·h supplied from the coefficient multiplier 35 thereto. In this case, in addition to the effects provided by the aforementioned third embodiment, the behaviors of the filter coefficients W0 and W1 of the adaptive notch filter 4 are monitored more easily. This simplifies the arithmetic algorithm, thereby facilitating creating of the program implemented in the discrete-computation processor unit 17.

As described above, the present invention is designed to mathematically produce a signal available for acoustically transferring the output from the adaptive notch filter to the microphone in accordance with the initial transfer characteristics, and add the signal and the output signal from the microphone together to employ the resulting signal in an adaptive control algorithm. Even when the present transfer characteristics have significantly changed from the initial transfer characteristics or the filter coefficient of an adaptive notch filter greatly changes due to incoming external noises, it is possible for the adaptive algorithm to operatively improve stability so as to suppress divergence as well as overcompensation at the ears of a passenger, thereby providing an ideal noise reduction effect.

Although the present invention has been fully described in connection with the preferred embodiment thereof, it is to be noted that various changes and modifications apparent to those skilled in the art are to be understood as included within the scope of the present invention as defined by the appended claims unless they depart therefrom.

What is claimed is:

1. An active noise control system comprising:

a cosine-wave generator for generating a cosine-wave signal in synchronization with a frequency of a problematic cyclic noise generated at a noise source;

a sine-wave generator for generating a sine-wave signal in synchronization with the frequency of said problematic noise;

a first one-tap adaptive filter for receiving a reference cosine-wave signal outputted from said cosine-wave generator;

a second one-tap adaptive filter for receiving a reference sine-wave signal outputted from said sine-wave generator;

an adder for adding together an output signal from said first one-tap adaptive filter and an output signal from said second one-tap adaptive filter;

secondary noise generator means, driven by an output signal from the adder, for producing a secondary noise to cancel said problematic noise;

residual signal detection means for sensing a residual signal resulting from interference between said secondary noise and said problematic noise;

simulation signal generator means for receiving said reference cosine-wave signal and said reference sine-wave signal to generate a simulation cosine-wave signal and a simulation sine-wave signal, said simulation cosine-wave and sine-wave signals being compensated in accordance with characteristics simulating transfer characteristics between said secondary noise generator means and said residual signal detection means; and compensated signal generator means for generating a compensated signal obtained by compensating the same signal as the output signal from said adder in accordance with the characteristics simulating the transfer characteristics between said secondary noise generator means and said residual signal detection means, wherein the output signal from said residual signal detection means, the output signal from said simulation signal generator means, and the output signal from said compensated signal generator means are used to update filter coefficients of said first one-tap adaptive filter and said second one-tap adaptive filter, thereby reducing said problematic noise at said residual signal detection means.

2. The active noise control system according to claim 1, wherein said compensated signal generator means generates a compensated signal obtained by compensating the same signal as the output signal from the adder in accordance with characteristics multiplied by a predetermined constant and simulating the transfer characteristics between said secondary noise generator means and said residual signal detection means.

3. The active noise control system according to claim 1 or 2, wherein said compensated signal generator means generates the compensated signal when at least one of respective cumulative amounts of changes in filter coefficient of the first one-tap adaptive filter and the second one-tap adaptive filter is greater than or equal to a predetermined value, the changes being obtained each time a filter coefficient of each filter is updated during a predetermined interval from a previous to a present point in time.

4. The active noise control system according to claim 1 or 2, wherein said compensated signal generator means generates the compensated signal when at least one of respective amounts of a change in filter coefficient of the first one-tap adaptive filter and the second one-tap adaptive filter is greater than or equal to a predetermined value, the change in filter coefficient of each filter being a difference between a present value and a previous value at a predetermined time interval past.

* * * * *